United States Patent
Zhang et al.

(10) Patent No.: US 6,784,747 B1
(45) Date of Patent: Aug. 31, 2004

(54) AMPLIFIER CIRCUIT

(75) Inventors: Shuyun Zhang, Brookline, MA (US); Robert Jeffery McMorrow, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/393,132

(22) Filed: Mar. 20, 2003

(51) Int. Cl.$^7$ .................................................. H03F 3/68
(52) U.S. Cl. .................................. 330/295; 330/124 R
(58) Field of Search ............................. 330/295, 124 R, 330/84; 455/126

(56) References Cited

U.S. PATENT DOCUMENTS

| | | | |
|---|---|---|---|
| 3,510,735 A | 5/1970 | Potter | |
| 3,577,092 A | 5/1971 | Kubicz | |
| 3,703,685 A | * 11/1972 | Simopoulos et al. | ....... 455/273 |
| 3,766,449 A | 10/1973 | Bruchez | |
| 3,860,460 A | 1/1975 | Olson | |
| 3,969,752 A | 7/1976 | Martin et al. | |
| 3,977,020 A | 8/1976 | Enzlin et al. | |
| 3,986,058 A | 10/1976 | Hongu et al. | |
| 3,990,092 A | 11/1976 | Yoshimura | |
| 4,081,759 A | * 3/1978 | Yen | .......................... 330/295 |
| 4,124,823 A | 11/1978 | Sechi | |
| 4,131,908 A | 12/1978 | Daub et al. | |
| 4,183,020 A | 1/1980 | Schade, Jr. | |
| 4,417,265 A | 11/1983 | Murkland et al. | |
| 4,584,536 A | * 4/1986 | Adachi | ....................... 330/295 |
| 4,631,495 A | 12/1986 | Mueller et al. | |
| 4,686,557 A | 8/1987 | Mahrla | |
| 4,725,876 A | 2/1988 | Kishi | |
| 4,728,902 A | 3/1988 | Gleason et al. | |
| 5,066,926 A | 11/1991 | Ramachandran et al. | |
| 5,109,262 A | 4/1992 | Kadota et al. | |
| 5,111,269 A | 5/1992 | Tsugaru | |
| 5,132,764 A | 7/1992 | Bayraktaroglu | |
| 5,214,394 A | 5/1993 | Wong | |
| 5,233,310 A | 8/1993 | Inoue | |
| 5,274,342 A | 12/1993 | Wen et al. | |
| 5,321,279 A | 6/1994 | Khatibzadeh et al. | |
| 5,352,911 A | 10/1994 | Grossman | |

(List continued on next page.)

FOREIGN PATENT DOCUMENTS

| | | |
|---|---|---|
| GB | 2140204 A | 11/1984 |
| JP | 55-165672 | 12/1980 |

OTHER PUBLICATIONS

William Liu et al., *The Use of Base Ballasting to Prevent the Collapse of Current Gain in AlGaAs/GaAs Heterojunction Bipolar Transistors*, 43(2) IEEE Transactions on Electron Devices 245 (Feb. 1996).

(List continued on next page.)

*Primary Examiner*—Henry Choe
(74) *Attorney, Agent, or Firm*—Iandiorio & Teska

(57) ABSTRACT

An amplifier circuit and fabrication method including a bias input node, an RF input node, an RF output node, and a plurality of amplifier cells. Each cell has a plurality of discrete emitter contacts of a first conductivity type, a plurality of discrete base contacts of a second conductivity type and grouped in two or more groups, at least one collector contact of the first conductivity type connected to the RF output node, and a base capacitor for each group having two electrodes: an input electrode coupled to the RF input node and an output electrode coupled to a group of discrete base contacts. There is also a base resistor for each group having an input coupled to the bias input node and an output coupled to a group of discrete base contacts. An emitter resistor is coupled to each discrete emitter contact to provide more effective base ballasting and thermal stability than with a cascode arrangement of HBT transistors.

13 Claims, 3 Drawing Sheets

U.S. PATENT DOCUMENTS

| | | | |
|---|---|---|---|
| 5,422,522 A | | 6/1995 | Rotay |
| 5,608,353 A | | 3/1997 | Pratt |
| 5,629,648 A | | 5/1997 | Pratt |
| 5,760,457 A | | 6/1998 | Mitsui et al. |
| 6,441,687 B1 | * | 8/2002 | Apel .......................... 330/296 |
| 6,686,801 B1 | * | 2/2004 | Cho et al. ................... 330/295 |

OTHER PUBLICATIONS

M. Gat et al., *A 4.0 Watt High Efficiency 15–18 GHZ Power MMIC*, 1991 IEEE Microwave & Millimeter–Wave Monolithic Circuits Symp. 93.

Paul Horowitz and Winfield Hill, The Art of Electronics 70 (Cambridge Univ. Press 1980).

Shuyun Zhang et al., An Advanced Power Amplifier Module for Quad–Band Wireless Applications, Asia Pacific Microwave Conference, Tyoto, Japan Nov. 19–22, 2002.

Zhang et al., U.S. patent application Ser. No. 10/400,774 (unpublished), filed Mar. 27, 2003.

* cited by examiner

AMPLIFIER CIRCUIT

FIELD OF THE INVENTION

This invention relates to an amplifier circuit useful, among other things, in wireless devices such as cellular telephones to amplify radio frequency signals.

BACKGROUND OF THE INVENTION

Amplifier circuits are used, among other things, to amplify a radio frequency (RF) signal within a wireless device such as a cellular telephone or personal data assistant. It is known in the art to construct such an amplifier circuit from a number of heterojunction bipolar transistors (HBTs) and also known that HBTs suffer from thermal runaway. See U.S. Pat. Nos. 5,629,648, 5,321,279 and 5,608,353 incorporated herein by this reference. In the '648 and '353 patents, the amplifier circuit includes a number of amplifiers each including an HBT with an emitter coupled to ground, a base, a collector, a base resistor, and a base capacitance in the form of a special segmented capacitor for each HBT to reduce the chances of thermal runaway.

Because the emitters of each HBT are coupled directly to ground, there is no emitter ballasting even though that technique is known to also reduce thermal runaways. See the '648 patent, col. 1, lines 43–50.

In the '279 patent, ballast impedances are added to the base fingers of an HBT but again, emitter ballasting is not provided for. Other relevant art includes U.S. Pat. No. 5,760,457 and the articles "The Use of Base Ballasting to Prevent the Collapse of Current Gain in ALGaAs/GaAs HBTs", W. Lui, et al., IEEE Transactions on Electronic Devices, Vol. 43, No. 2, February 1996; "Handbook of III–IV HBTs", W. Lui, John Wiley and Sons, 1998; and "Horowitz and Hill: The Art of Electronics", Paul Horowitz, Winfield Hill, Cambridge University Press, NY, N.Y. 1980, also included herein by this reference.

Employing both base and emitter ballasting for the HBTs in accordance with the prior art typically requires a large area circuit resulting in high fabrication costs.

SUMMARY OF THE INVENTION

It is therefore an object of this invention to provide an amplifier with base ballasting and also, preferably, emitter ballasting to fully address thermal runaway.

It is a further object of this invention to provide such an amplifier at a lower cost.

It is a further object of this invention to provide such an amplifier which does not require a large circuit area.

This invention results from the realization that by forming amplifier cells with emitter fingers, base fingers, and collector fingers, and by splitting the base ballasting amongst different base fingers, then base and also, if desired, emitter ballasting can be provided to prevent thermal runaway and, at the same time, the layout area is optimized.

This invention features an amplifier circuit comprising a bias input node, an RF input node, an RF output node, and a plurality of amplifier cells. The cells each preferably include a plurality of discrete emitter contacts of a first conductivity type, a plurality of discrete base contacts of a second conductivity type and grouped in two or more groups, at least one collector contact of the first conductivity type connected to the RF output node, and a base capacitor for each group having two electrodes: an input electrode coupled to said RF input node and an output electrode coupled to a group of discrete base contacts. There is a base resistor for each group having an input coupled to the bias input node and an output coupled to a group of discrete base contacts. An emitter resistor may be coupled to each discrete emitter contact to provide more effective ballasting and thermal stability than with a paralleled arrangement of HBT transistors. Typically, the number of base contacts in each group is the same.

One amplifier circuit in accordance with this invention features a bias input node, a signal input node, a signal output node, and a plurality of amplifier cells each including a plurality of discrete emitter contacts of a first conductivity type, a plurality of discrete base contacts of a second conductivity type and grouped in two or more groups, a base capacitor for each group, each base capacitor having two electrodes, an input electrode coupled to said signal input node, and an output electrode coupled to a group of discrete base contacts, and a base resistor for each group, each base resistor having an input coupled to the bias input node and an output coupled to a group of discrete base contacts. Each cell may also include at least one collector contact coupled to the signal output node.

Another amplifier circuit in accordance with this invention features a bias input node, a signal input node, a signal output node, and a plurality of amplifier cells each including a plurality of discrete emitter contacts of a first conductivity type, a plurality of discrete base contacts of a second conductivity type and grouped in two or more groups and coupled to the signal input node, at least one collector contact of the first conductivity type coupled to the signal output node, and a base resistor for each group, each base resistor having an input coupled to the bias input node and an output coupled to a group of discrete base contacts. Each cell may also include a base capacitor for each group of base contacts.

An amplifier cell in accordance with this invention typically has a plurality of discrete emitter contacts of a first conductivity type, a plurality of discrete base contacts of a second conductivity type and grouped in two or more groups, at least one collector contact of the first conductivity type, a base capacitor for each group, each base capacitor having two electrodes, an input electrode coupled to a signal input node and an output electrode coupled to a group of discrete base contacts, a base resistor for each group, each base resistor having an input coupled to a bias input node and an output coupled to a group of discrete base contacts, and an emitter resistor coupled to each discrete emitter contact.

One amplifier circuit fabrication method in accordance with this invention includes the steps of providing a bias input node, providing an RF input node, providing an RF output node, and forming a plurality of amplifier cells to each include: a plurality of discrete emitter contacts of a first conductivity type, a plurality of discrete base contacts of a second conductivity type grouped in two or more groups, at least one collector contact of the first conductivity type connected to the RF output node, a base capacitor for each group, each base capacitor having two electrodes, an input electrode coupled to said RF input node, and an output electrode coupled to a group of discrete base contacts, a base resistor for each group, each base resistor having an input coupled to the bias input node and an output coupled to a group of discrete base contacts, and an emitter resistor coupled to each discrete emitter contact to provide more effective ballasting and thermal stability than with a paralleled arrangement of HBT transistors.

Another amplifier circuit fabrication method comprises: providing a bias input node, providing a signal input node, providing a signal output node, and forming a plurality of amplifier cells to each include a plurality of discrete emitter contacts of a first conductivity type, a plurality of discrete base contacts of a second conductivity type grouped in two or more groups, a base capacitor for each group, each base capacitor having two electrodes, an input electrode coupled to said signal input node, and an output electrode coupled to a group of discrete base contacts, and a base resistor for each group, each base resistor having an input coupled to the bias input node and an output coupled to a group of discrete base contacts. This method may further include forming a collector contact coupled to the signal output node.

Still another amplifier circuit fabrication method in accordance with this invention features providing a bias input node, providing a signal input node, providing a signal output node, and forming a plurality of amplifier cells to each include: a plurality of discrete emitter contacts of a first conductivity type, a plurality of discrete base contacts of a second conductivity type grouped in two or more groups and coupled to the signal input node, at least one collector contact of the first conductivity type coupled to the signal output node, and a base resistor for each group, each base resistor having an input coupled to the bias input node and an output coupled to a group of discrete base contacts. This method may further include the step of providing a base capacitor for each base contact group.

An amplifier cell fabrication method in accordance with this invention features the steps of forming a plurality of discrete emitter contacts of a first conductivity type, forming a plurality of discrete base contacts of a second conductivity type grouped in two or more groups, forming at least one collector contact of the first conductivity type, forming a base capacitor for each group, each base capacitor having two electrodes, an input electrode coupled to a signal input node and an output electrode coupled to a group of discrete base contacts, forming a base resistor for each group, each base resistor having an input coupled to a bias input node and an output coupled to a group of discrete base contacts, and forming an emitter resistor coupled to each discrete emitter contact.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
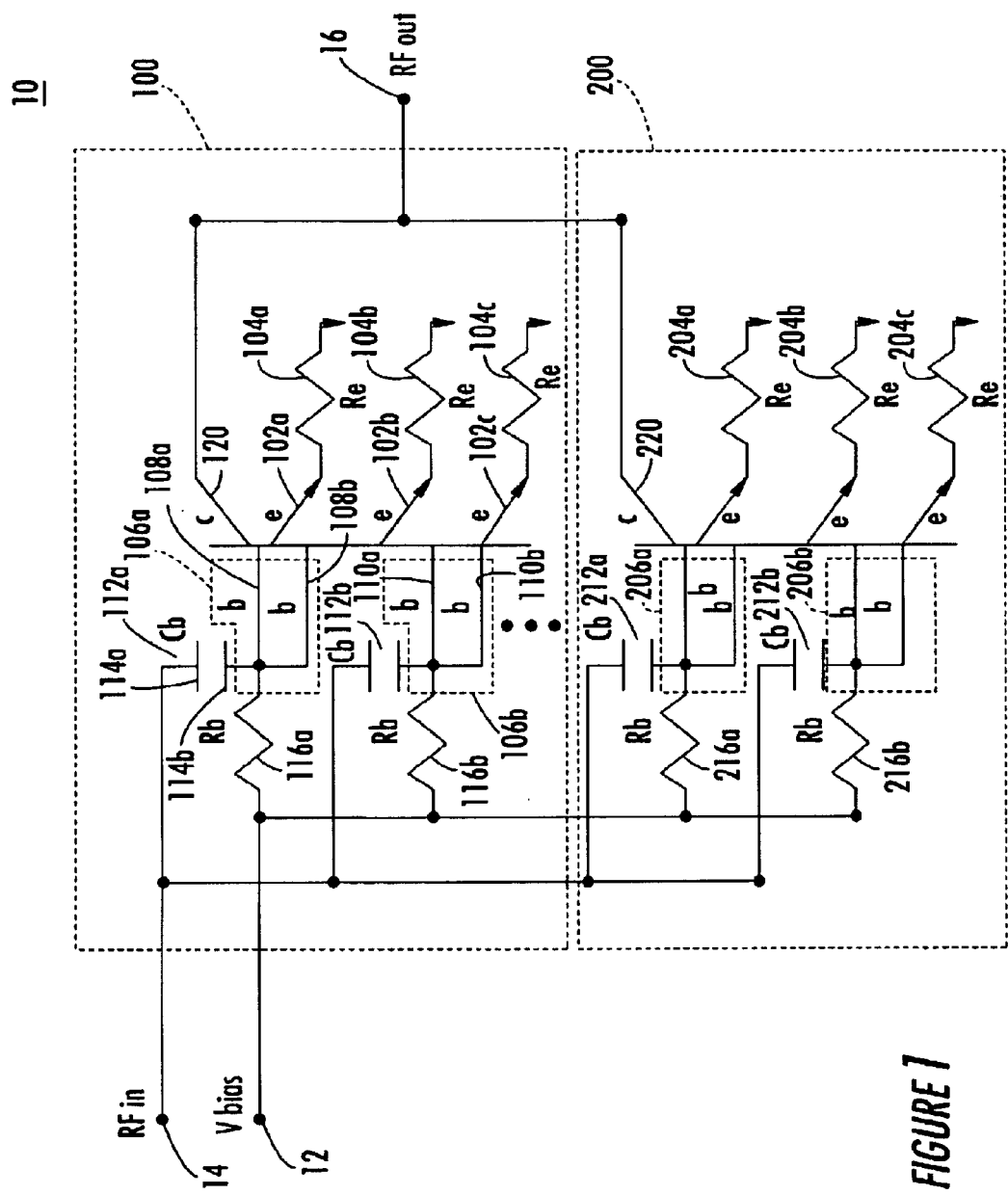
FIG. 1 is a circuit diagram showing two amplifier cells in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

One amplifier circuit 10, FIG. 1, in accordance with this invention, includes bias input node 12, RF input node 14, RF output node 16, and a plurality of amplifier cells 100 and 200 in contrast to typical HBTs. There may be as many as seventy or more such cells although only two are shown in FIG. 1. Also, the bias, signal input, and signal output nodes need not be limited to the amplification of RF signals. Each cell, as shown for cell 100, includes a plurality of (e.g., three) discrete emitter contacts or fingers 102a, 102b, and 102c of a first conductivity type and emitter resistors 104a, 104b, and 104c, if desired, to provide emitter ballasting. There are also a plurality of discrete base contacts of a second conductivity type grouped together in two or more groups 106a and 106b. Thus, group 106a includes base contacts 108a and 108b and group 106b includes base contacts 110a and 110b and there is a base capacitor for each group. Thus, base capacitor 112a has input electrode 114a coupled to RF input node 14 and output electrode 114b coupled to group 106a Base capacitor 112b for group 106b is constructed in a similar fashion. Special segmented capacitances as disclosed in the '648 and '353 patents are not required or preferred.

There is also a base resistance for each group of base contacts. Thus, base resistor 116a for group 106a has an input coupled to bias input node 12 and an output coupled to group 106a as shown while base resistor 116b has an input coupled to bias input node 12 and an output coupled to group 106b. Collector contact 120 has the same conductivity as the emitters and is coupled to RF output node 16. Cell 200 is constructed in a similar fashion and includes, inter alia, base groups 206a and 206b, base resistors 216a and 216b, base capacitances 212a and 212b, and emitter resistors 204a, 204b, and 204c. Collector 220 is connected to RF output node 16. The input electrode of each base capacitor 212a and 212b is coupled to RF input node 14, and the input of each base resistance 216a and 216b is coupled to bias input node 12.

This split base arrangement is optimal in terms of balancing and circuit layout. As the collector current increases, the emitter current increases and the junction temperature increases. If thermal instability occurs at emitter 102a or 102c, the base current through resistor 116a or 116b will increase and thus the voltage drop across the resistors will increase resulting in less voltage across the emitter-base junction. The base ballasting resistance effectively increases for the hot finger that draws more current. As for finger 102b, resistors 116a and 116b will both effectively increase when finger 102b draws more current than the others.

In the case when many cells are connected in parallel, all of the base resistances play the same role as inside the single cell and they prevent current overflow in a single cell or one single emitter junction. In each emitter finger, the ballasting resistor may be inserted between the emitter and ground. The emitter ballast resistor is provided to improve the thermal stability of the cell and plays the same role as the base ballast resistor. The more resistance put into the emitter, the more effective it is. However, a high emitter resistance can cause output power and power-added-efficiency (PAE) to decrease, which is not desirable in some applications.

The subject invention thus combines split base and emitter ballasting to form basic cells. The advantage of this arrangement is a smaller layout area, smaller emitter and ballast resistors to provide a high output power and PAE, and smaller base resistors for simpler base ballasting. The split base resistors have the advantage of almost doubling the effective thermal protection with little or no increase in circuit layout size.

Figure 2:
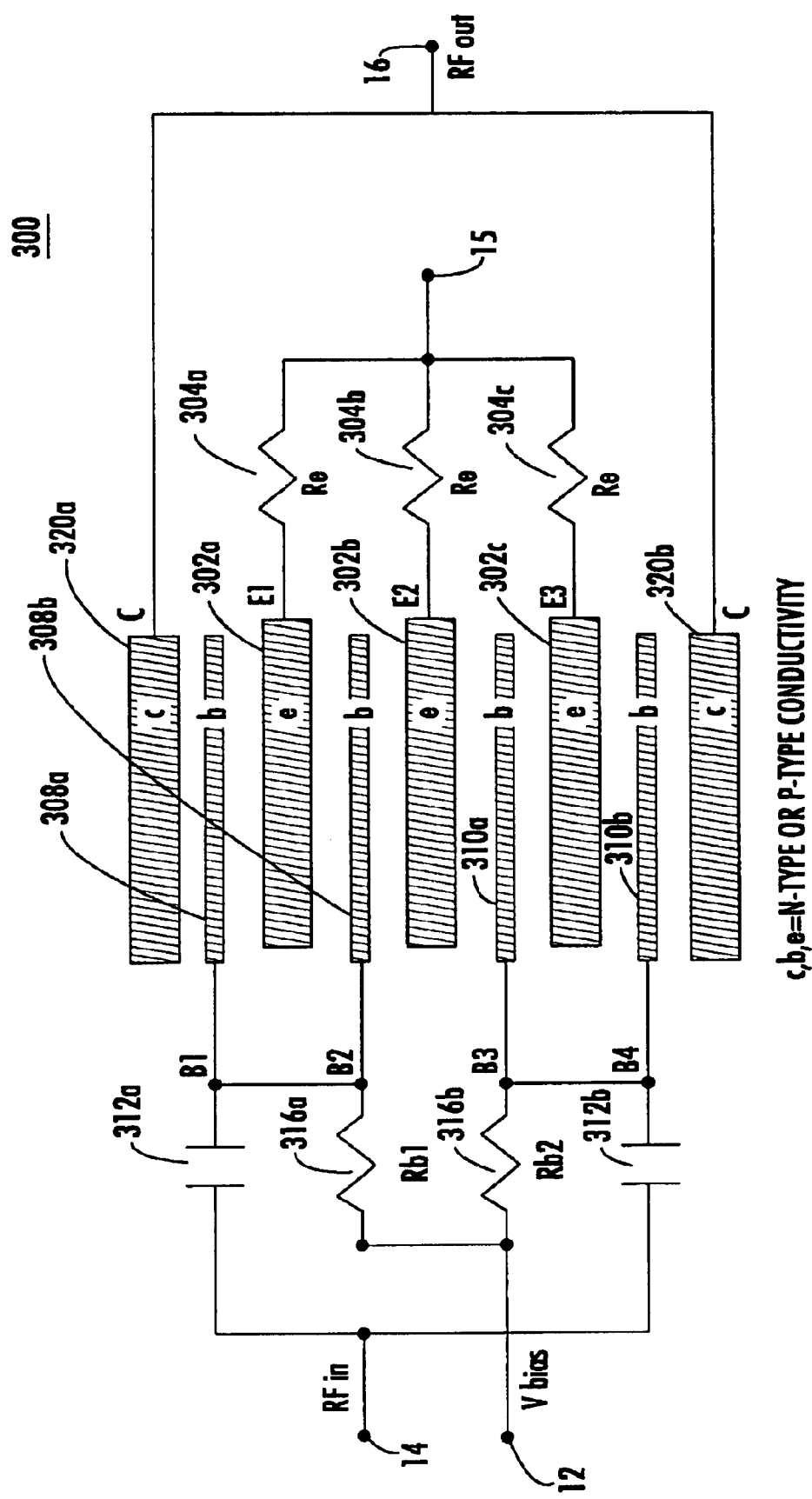
FIG. 2 is a view showing the layout of a typical amplifier cell in accordance with the subject invention.
Figure 3:
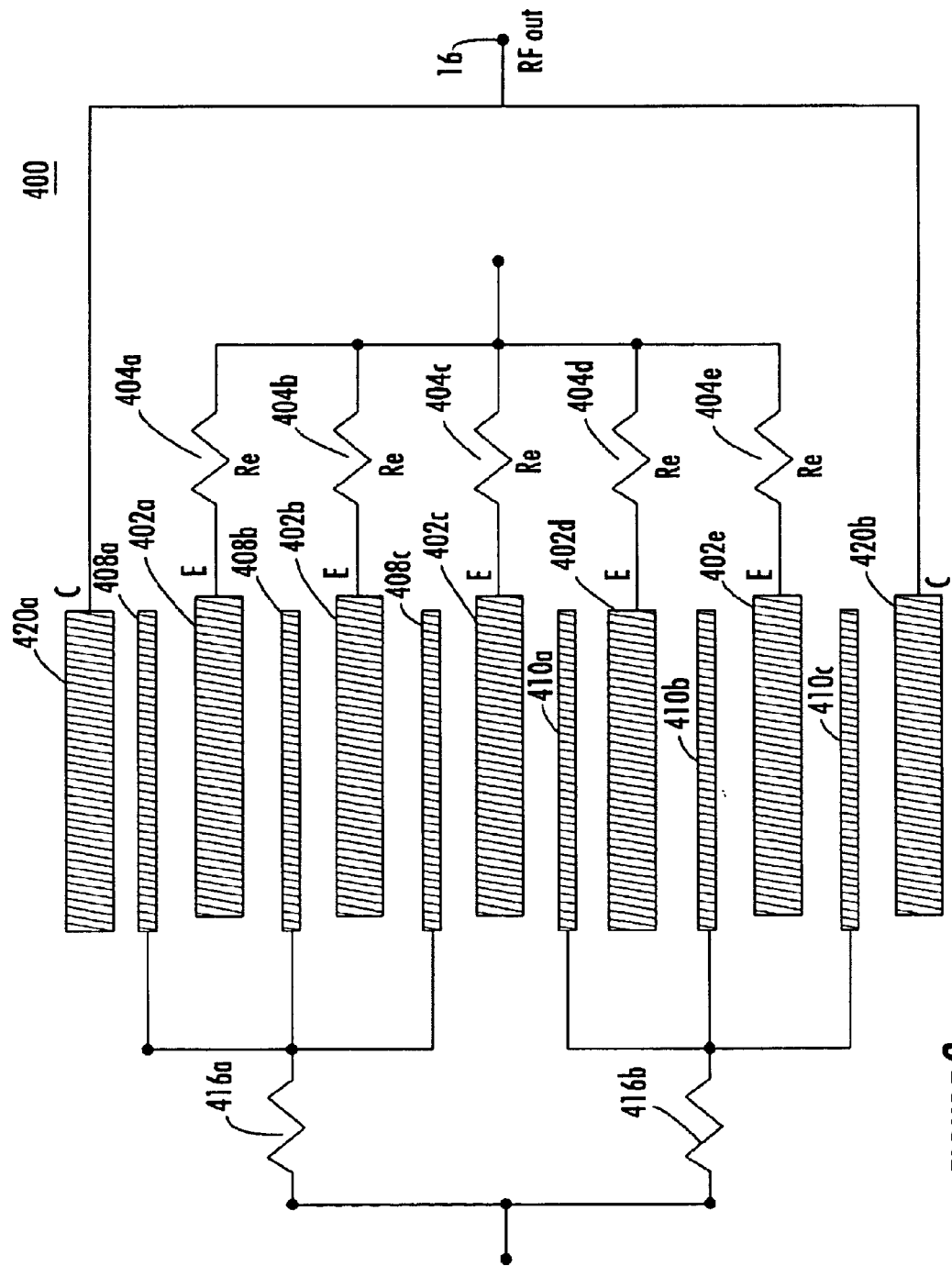
FIG. 3 is a view showing the layout of another amplifier cell in accordance with the subject invention.

FIGS. 2 and 3 show possible cell arrangements. Cell 300, FIG. 2 includes discrete emitter contacts 302a, 302b, and 302c each with an emitter resistances 304a, 304b, and 304c coupled to common node 15 (e.g., ground). Base contacts 308a and 208b constitute one group with base resistor 316a and base capacitance 312a and base contacts 310a and 310b constituting the other group with base resistances 316b and base capacitance 312b. Here, there are two collectors 320a and 320b connected to RF out node 16. Once again, there would be many such cells in a typical amplifier. The emitter, base and collector contacts of each cell 300 may have either N-type or P-type conductivity as is typical with transistors.

FIG. 3 shows another possible cell arrangement 400 which includes discrete emitter contacts 402a–402e each with emitter resistor 304a–304f. Base contacts 408a–408c form one group with base resistance 416a and base contacts 410a–410c form the other group with base resistance 416b. Collector contacts 420a and 420b complete the amplifier cell.

Although perhaps not preferred, the above described technique could also cover asymmetrical arrangements where ballasting is split between a group of n base fingers and a group of m base fingers where n does not equal m. This can be successfully implemented if the proper weighting is used between the resistor values.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An amplifier circuit comprising:
   a bias input node;
   an RF input node;
   an RF output node; and
   a plurality of amplifier cells each including:
      a plurality of discrete emitter contacts of a first conductivity type,
      a plurality of discrete base contacts of a second conductivity type and grouped in two or more groups,
      at least one collector contact of the first conductivity type connected to the RF output node,
      a base capacitor for each group, each base capacitor having two electrodes, an input electrode coupled to said RF input node, and an output electrode coupled to a group of discrete base contacts,
      a base resistor for each group, each base resistor having an input coupled to the bias input node and an output coupled to a group of discrete base contacts, and
      an emitter resistor coupled to each discrete emitter contact to provide more effective ballasting and thermal stability than with a parallel arrangement of HBT transistors.

2. The amplifier circuit of claim 1 in which the number of base contacts in each group is the same.

3. An amplifier circuit comprising:
   a bias input node;
   a signal input node;
   a signal output node; and
   a plurality of amplifier cells each including:
      a plurality of discrete emitter contacts of a first conductivity type,
      a plurality of discrete base contacts of a second conductivity type and grouped in two or more groups,
      a base capacitor for each group, each base capacitor having two electrodes, an input electrode coupled to said signal input node, and an output electrode coupled to a group of discrete base contacts, and
      a base resistor for each group, each base resistor having an input coupled to the bias input node and an output coupled to a group of discrete base contacts.

4. The amplifier circuit of claim 3 further including a collector contact coupled to the signal output node.

5. An amplifier circuit comprising:
   a bias input node;
   a signal input node;
   a signal output node; and
   a plurality of amplifier cells each including:
      a plurality of discrete emitter contacts of a first conductivity type,
      a plurality of discrete base contacts of a second conductivity type and grouped in two or more groups and coupled to the signal input node,
      at least one collector contact of the first conductivity type coupled to the signal output node, and
      a base resistor for each group, each base resistor having an input coupled to the bias input node and an output coupled to a group of discrete base contacts.

6. The circuit of claim 5 further including a base capacitor for each group of base contacts.

7. An amplifier cell comprising:
   a plurality of discrete emitter contacts of a first conductivity type;
   a plurality of discrete base contacts of a second conductivity type and grouped in two or more groups;
   at least one collector contact of the first conductivity type;
   a base capacitor for each group, each base capacitor having two electrodes, an input electrode coupled to a signal input node and an output electrode coupled to a group of discrete base contacts;
   a base resistor for each group, each base resistor having an input coupled to a bias input node and an output coupled to a group of discrete base contacts; and
   an emitter resistor coupled to each discrete emitter contact.

8. An amplifier circuit fabrication method comprising:
   providing a bias input node;
   providing an RF input node;
   providing an RF output node; and
   forming a plurality of amplifier cells to each include:
      a plurality of discrete emitter contacts of a first conductivity type,
      a plurality of discrete base contacts of a second conductivity type grouped in two or more groups,
      at least one collector contact of the first conductivity type connected to the RF output node,
      a base capacitor for each group, each base capacitor having two electrodes, an input electrode coupled to said RF input node, and an output electrode coupled to a group of discrete base contacts,
      a base resistor for each group, each base resistor having an input coupled to the bias input node and an output coupled to a group of discrete base contacts, and
      an emitter resistor coupled to each discrete emitter contact to provide more effective ballasting and thermal stability than with a parallel arrangement of HBT transistors.

9. An amplifier circuit fabrication method comprising:

providing a bias input node;

providing a signal input node;

providing a signal output node; and forming a plurality of amplifier cells to each include:
- a plurality of discrete emitter contacts of a first conductivity type,
- a plurality of discrete base contacts of a second conductivity type grouped in two or more groups,
- a base capacitor for each group, each base capacitor having two electrodes, an input electrode coupled to said signal input node, and an output electrode coupled to a group of discrete base contacts, and
- a base resistor for each group, each base resistor having an input coupled to the bias input node and an output coupled to a group of discrete base contacts.

10. The method of claim 9 further including forming a collector contact coupled to the signal output node.

11. An amplifier circuit fabrication method comprising:

providing a bias input node;

providing a signal input node;

providing a signal output node; and forming a plurality of amplifier cells to each include:
- a plurality of discrete emitter contacts of a first conductivity type,
- a plurality of discrete base contacts of a second conductivity type grouped in two or more groups and coupled to the signal input node,
- at least one collector contact of the first conductivity type coupled to the signal output node, and
- a base resistor for each group, each base resistor having an input coupled to the bias input node and an output coupled to a group of discrete base contacts.

12. The method of claim 11 further including the step of providing a base capacitor for each base contact group.

13. An amplifier cell fabrication method comprising:

forming a plurality of discrete emitter contacts of a first conductivity type;

forming a plurality of discrete base contacts of a second conductivity type grouped in two or more groups;

forming at least one collector contact of the first conductivity type;

forming a base capacitor for each group, each base capacitor having two electrodes, an input electrode coupled to a signal input node and an output electrode coupled to a group of discrete base contacts;

forming a base resistor for each group, each base resistor having an input coupled to a bias input node and an output coupled to a group of discrete base contacts; and forming an emitter resistor coupled to each discrete emitter contact.

* * * * *